United States Patent [19]

Darden, Jr.

[11] 4,057,757
[45] Nov. 8, 1977

[54] POWER PACK AND CARRIER FOR CB RADIO

[76] Inventor: William T. Darden, Jr., 20 Springside Drive, Asheville, N.C. 28806

[21] Appl. No.: 697,106

[22] Filed: June 17, 1976

[51] Int. Cl.² .............................................. H01B 1/38
[52] U.S. Cl. ..................................... 325/16; 224/5 H; 224/26 R
[58] Field of Search ............. 224/5 R, 5 H, 5 A, 5 B, 224/5 V, 8 R, 13, 14, 19, 26 R, 26 B, 45 N, 45 M, 45 Q, 45 G, 49, 53, 55, 54, 58; 307/150; 2/DIG. 6; 325/16, 118, 361; 150/34, 52 J

[56] References Cited

U.S. PATENT DOCUMENTS

| 1,090,079 | 3/1914 | Livingston | 224/5 R |
|---|---|---|---|
| 1,500,510 | 7/1924 | McElva et al. | 224/5 H |
| 1,505,884 | 8/1924 | Goldquist | 224/5 V X |
| 1,723,147 | 8/1929 | Fourethier | 224/5 H |
| 2,136,357 | 11/1938 | Darling et al. | 224/5 V |
| 2,324,194 | 7/1943 | Campiglia | 224/5 H |
| 3,370,236 | 2/1968 | Walker | 325/16 |
| 3,919,615 | 11/1975 | Niecke | 224/5 H X |

Primary Examiner—Albert J. Makay
Attorney, Agent, or Firm—John N. Randolph

[57] ABSTRACT

A carrier in which CB radios of different sizes can be detachably secured for convenience in carrying. The power pack, consisting of a plurality of dry cell batteries connected together in series and a battery holder forming a part of the carrier, provides a portable power source for the radio. The carrier is constructed to be supported by a part of the body of the user and is provided with means for detachably supporting an aerial connected to the radio.

6 Claims, 4 Drawing Figures

POWER PACK AND CARRIER FOR CB RADIO

SUMMARY

It is a primary object of the present invention to provide a carrier by which a CB radio may be conveniently supported and carried on the body of the user and which includes a portable power pack for supplying electric current to the radio while supported in the carrier.

Another object of the invention is to provide a unit capable of being utilized for converting a CB radio normally mounted in a vehicle into a portable unit which may be carried on the body of a user and powered by an electric source forming a part of the unit.

Still a further object of the invention is to provide such a unit having means for detachably supporting an aerial connected to the CB radio.

Various other objects and advantages of the invention will hereinafter become more fully apparent from the following description of the drawing illustrating a presently preferred embodiment thereof, and wherein:

DESCRIPTION OF THE PREFERRED EMBODIMENT

Figure 1:
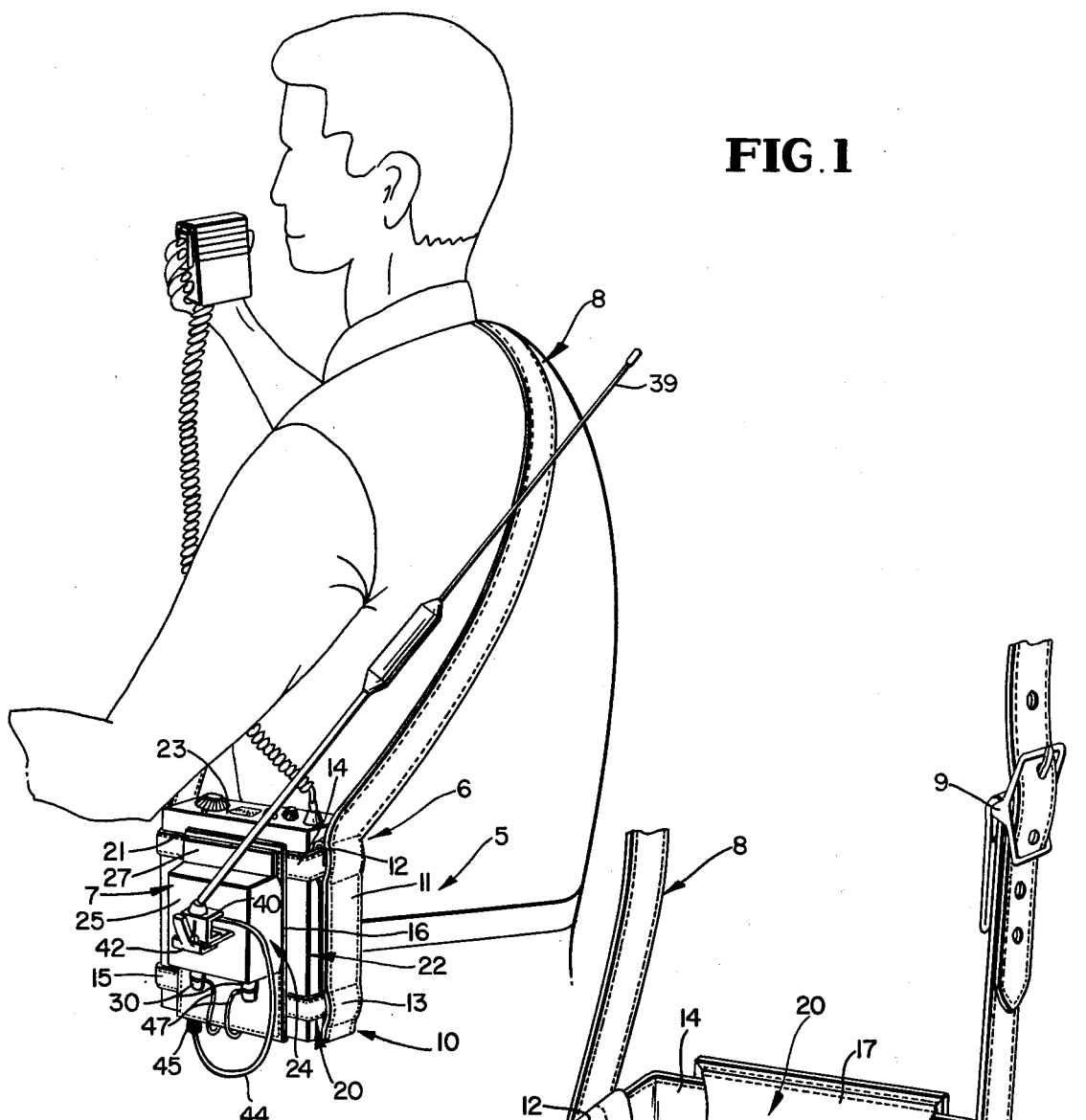
FIG. 1 is a perspective view showing the power pack and carrier in use.

Referring more specifically to the drawings, the power pack and carrier in its entirety and comprising the invention is designated generally 5 and includes a carrier 6 and a power pack 7.

The carrier 6 includes an elongated shoulder engaging strap 8 having a buckle 9 attached to one end thereof and to which the other end of the strap is detachably and adjustably connected. The strap 8 has a lower portion 10 including complementary side portions 11 each having an upper loop 12 and a lower loop 13. An upper strap 14 extends through the loops 12 and the lower strap 15 extends through the loops 13. A panel or wall member 16 is provided with sleeves 17 at upper and lower ends thereof and on its innerside through which portions of the straps 14 and 15 extend.

Opposite sides of the two end portions of the straps 14 and 15 are provided with VELCRO fasteners 18 by means of which the ends of each strap can be adjustably secured together to combine with the strap portions 11, panel 16, and a portion 19 of the strap 8 which extends between the lower loops 13, to form a pocket 20 having an open upper end 21, formed by the strap 14 and the upper portion of the panel 16, and a closed lower end formed by the strap portion 19.

A conventional CB radio 22, FIG. 1, is positioned against the innerside of the panel 16. The ends of each strap 14 and 15 are then connected together to snugly embrace the radio 22 which is disposed with its back end resting on the strap portion or pocket bottom 19 and with its front end, having the controls 23 and the microphone connection, disposed in or protruding from the open end 21 of the pocket 20. The shoulder strap 8 is then positioned over one shoulder of the user, as illustrated in FIG. 1, and with the strap ends adjusted so that the pocket 20, containing the radio 22, will be located on the other side of the body of the user at approximately the level of the waist. The pocket 20 is disposed so that the panel or wall 16 constitutes the outer or exposed side of the pocket, as clearly illustrated in FIG. 1.

The power pack 7 includes a housing 24 formed in part by the wall member 16. The housing 24 also includes a hood member 25 a part of which is stitched or otherwise secured at 26 to the outer side of the wall member 16 and another, remote part of which has a tab or extension 27 which is detachably connected by another VELCRO fastener 28 to another part of the outer side of the wall 16.

Figure 4:
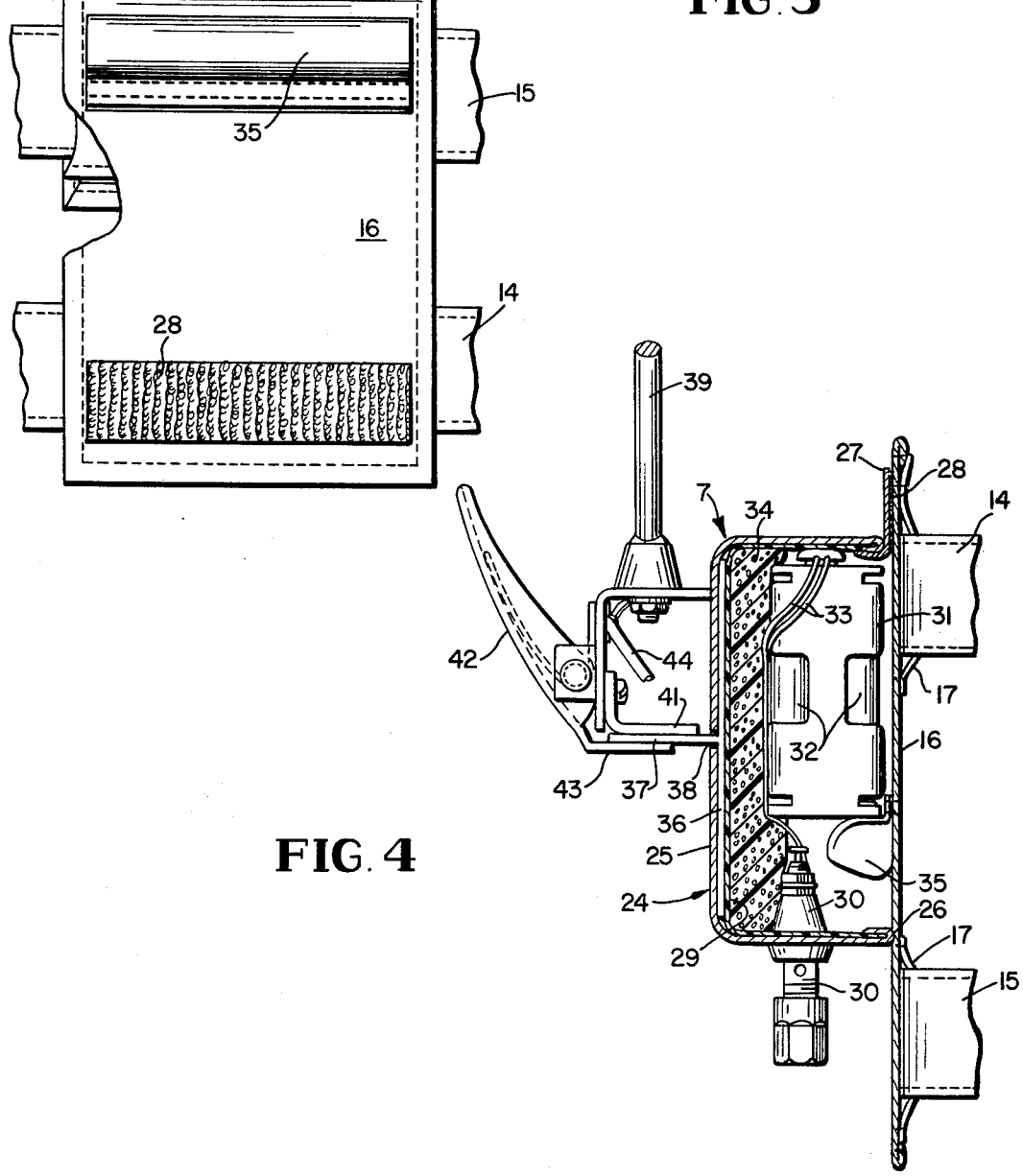
FIG. 4 is an enlarged fragmentary vertical sectional view taken through the power pack and showing the aerial mounted thereon.

The hood 25 is preferably lined with a sheet of plastic 29. A pair of conventional contact posts 30 are secured in and extend through a wall of the hood 25. The hood 25 contains a conventional battery holder or clip 31 which supports a plurality of conventional dry cell batteries 32 which are connected together in series. Conductors 33 which are connected to inner ends of the posts 30 lead from positive and negative terminals of the clip 31 for connecting the batteries 32 to said posts 30. The clip 31, containing the batteries, is contained in the hood 25 between the wall 16 and a pad 34 of a yieldable foam insulating material which fills the outer part of said hood, as seen in FIG. 4. A spacer member 35 is secured across the outer side of the wall 16 and is disposed in the cavity of the housing 24 to support the battery clip 31 out of contact with the posts 30.

A rigid plate 36 is contained in the outer part of the hood 25, between its outer surface and the lining 29. A rigid bar 37 extends outwardly from the plate 36 through an opening 38 of the hood 25.

Figure 2:
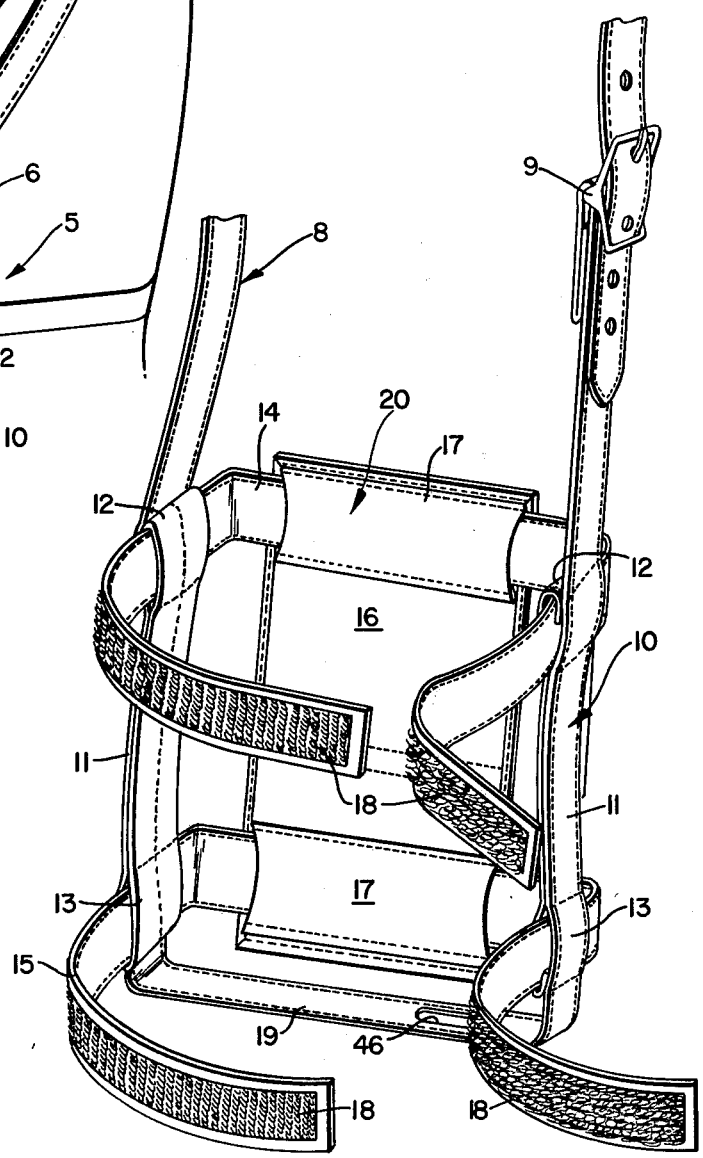
FIG. 2 is an enlarged fragmentary perspective view of the lower portion of the carrier with the pocket open.
Figure 3:
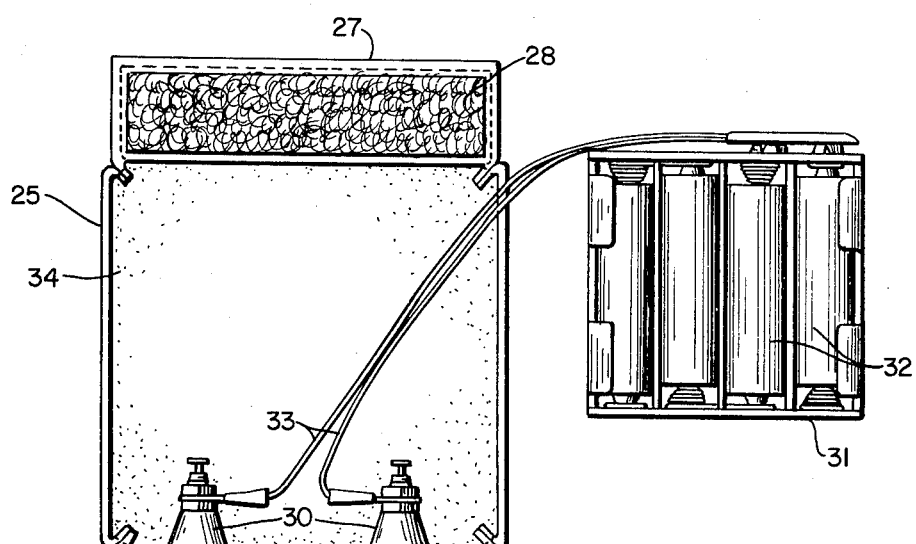
FIG. 3 is an enlarged fragmentary plan view showing the housing of the power pack in an open extended position and with the battery holder removed therefrom.

A conventional aerial 39 has a bracket 40 forming the base thereof and to which is connected a stationary clamp jaw 41. A spring clamp 42 which is pivotally supported on the bracket 40 has a jaw 43 which is spring urged toward the jaw 41 for clamping the bar 37 therebetween, to mount the aerial 39 detachably on the power pack housing 24, as illustrated in FIGS. 1 and 4. A cable 44, leading from the aerial 39, is connected by its coupling 45 to the conventional aerial connection, not shown, at the rear end of the radio 22. Said coupling 45 extends through an opening 46, FIG. 2, in the strap portion 19. Two conductors 47 from the radio 22 are detachably clamped in the outer ends of the posts 30 to complete the electrical connection between the batteries 32 and the radio 22.

The batteries 32 provide a combined voltage of at least twelve volts for powering the radio 22 which thus functions as a portable transmitting and receiving unit and is supported by the carrier 6 connected to the power pack 24 and aerial 39.

The carrier may be formed of various flexible materials including fabrics, leather and plastic. Other types of fasteners may be substituted for the VELCRO fasteners and various other modifications and changes are contemplated and may be resorted to without departing from the function or scope of the invention.

I claim as my invention:

1. A power pack and carrier comprising a body member of a flexible non-elastic material having a pocket receiving a CB radio, said pocket having an outer wall, a housing forming a part of said outer wall, dry cell batteries connected together in series and contained within said housing, means electrically connecting the batteries to the radio, said pocket having an open upper end affording access to the controls of the radio, said pocket being formed in part by straps having adjustable fastening means by which the radio is secured in said pocket and for varying the size of the pocket to accommodate radios of different sizes, a body engaging member forming a part of said carrier and adapted to engage and be supported by a part of the body of the user, and said pocket having a lower end wall provided with a restricted opening to receive an antenna coupling for attachment to the radio.

2. A power pack and carrier as in claim 1, and a bracket mounted on said carrier and to which an antenna is adapted to be detachably connected for mounting the antenna on the carrier.

3. A power pack and carrier comprising a body member of a flexible non-elastic material having a pocket receiving a CB radio, a housing forming a part of said carrier and mounted on the exterior of said pocket, dry cell batteries connected together in series and contained in said housing, means detachably connecting the batteries to the radio, a body engaging member forming a part of said carrier and adapted to engage and be supported by a part of the body of the user, said housing comprising a part of one wall of the pocket and a hood-shaped member, means hingedly connecting a part of the hood-shaped member to said part of the pocket, fastening means detachably connecting another part of said hood-shaped member to said part of the pocket, said hood-shaped member defining a cavity accommodating the batteries, a pair of contact posts supported by said last mentioned part of the hood-shaped member having inner ends electrically connected to conductors leading from the batteries and outer ends detachably connected to conductors leading from the radio, said contact posts and conductors constituting said means detachably connecting the batteries to the radio.

4. A power pack and carrier as in claim 3, and a bracket mounted on said carrier and to which an antenna is adapted to be detachably connected for mounting the antenna on the carrier.

5. A power pack and carrier as in claim 4, said pocket having an open end providing an access opening for the controls of the radio.

6. A power pack and carrier as in claim 5, said pocket having a wall located opposite to its open end provided with a restricted opening to receive an antenna coupling for attachment to the radio.

* * * * *